(12) United States Patent
Yang

(10) Patent No.: US 7,547,594 B2
(45) Date of Patent: Jun. 16, 2009

(54) METAL-OXIDE-SEMICONDUCTOR TRANSISTOR AND METHOD OF FORMING THE SAME

(75) Inventor: Chin-Sheng Yang, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 11/870,427

(22) Filed: Oct. 11, 2007

(65) Prior Publication Data

US 2009/0095990 A1    Apr. 16, 2009

(51) Int. Cl.
*H01L 21/336* (2006.01)
*H01L 21/8234* (2006.01)

(52) U.S. Cl. .................. 438/197; 438/200; 438/586; 438/597; 438/620

(58) Field of Classification Search .................. 438/197, 438/200, 586, 597, 620
See application file for complete search history.

(56) References Cited

U.S. PATENT DOCUMENTS

| 5,405,795 A | * | 4/1995 | Beyer et al. ................. 438/151 |
| 2003/0008450 A1 | * | 1/2003 | Tsai et al. ................... 438/200 |
| 2008/0153241 A1 | * | 6/2008 | Hsu et al. ................... 438/305 |

* cited by examiner

*Primary Examiner*—Thao X Le
*Assistant Examiner*—Eric W Jones
(74) *Attorney, Agent, or Firm*—Winston Hsu

(57) ABSTRACT

A method of forming a metal-oxide-semiconductor (MOS) transistor device is provided. First, a semiconductor substrate is prepared. Subsequently, a gate structure is formed on the semiconductor substrate. The gate structure includes a first strip portion and a second strip portion that is not parallel to the first strip portion. The gate structure further includes a junction between the first strip portion and the second strip portion. Thereafter, a stressed cap layer is formed on the semiconductor substrate, and covers the gate structure. Next, a portion of the stressed cap layer is removed to expose the junction between the first strip portion and the second strip portion.

17 Claims, 15 Drawing Sheets

METAL-OXIDE-SEMICONDUCTOR TRANSISTOR AND METHOD OF FORMING THE SAME

BACKGROUND OF THE INVENTION

1. Field of the Invention

The present invention generally relates to the field of metal-oxide-semiconductor (MOS) transistors, and more particularly, to a method for forming a MOS transistor comprising strained silicon.

2. Description of the Prior Art

A metal-oxide-semiconductor is a common electronic device used in integrated circuits. The MOS transistor is a semiconductor device usually formed by a gate, a source, and a drain. By utilizing channel effects generated by the gate of the MOS under a plurality of different gate voltages, the MOS is often made to function as a digitalized solid switch being applied on various integrated circuits for memory or logic devices.

Please refer to FIGS. 1-3, where FIGS. 1-3 are schematic diagrams illustrating a conventional method of fabricating a MOS transistor. As shown in FIG. 1, a semiconductor substrate 16 is first prepared. A gate dielectric layer 14 and a gate 12, which is positioned on the dielectric layer 14, are formed on the semiconductor substrate 16, where the gate dielectric layer 14 and the gate 12 form a gate structure. Subsequently, a shallow source extension 17 and a shallow drain extension 19 are formed within the semiconductor substrate 16 on two opposite sides of the gate structure 12. The shallow source extension 17 and the shallow drain extension 19 are separated by a channel region 22 of the MOS transistor. For an N-type metal-oxide-semiconductor (NMOS) transistor, the dopant species of the shallow source extension 17 and the shallow drain extension 19 may be N-type dopant species, such as arsenic, antimony, or phosphorous. Next, a liner 30 and a spacer 32 are formed around the sidewalls of the gate 12.

As shown in FIG. 2, an ion implantation process is carried out afterwards to implant dopants into the semiconductor substrate 16. Accordingly, a source region 18 and a drain region 20 are formed on the opposite sides of the gate 12 within the semiconductor substrate 16, thereby forming a MOS transistor 34. As mentioned above, the dopant species may be N-type dopant species, such as arsenic, antimony, or phosphorous, for the NMOS transistor.

Furthermore, as shown in FIG. 3, a stressed cap layer 46 is formed above the semiconductor substrate 16 and to cover the surface of the MOS transistor 34. The stressed cap layer 46 comprises mainly of silicon nitride so as to provide a tensile stress on the MOS transistor 34. Next, an activating process is performed on the stressed cap layer 46 to make the MOS transistor 34 memorizes or retains the stress.

As known to those skilled in the art, the higher the stress of the stressed cap layer 46 is, the more the stress of the stressed cap layer 46 can effectively expand the lattice arrangement in the channel region 22 of the semiconductor substrate 16. Accordingly, the Ion gain of the MOS transistor 34 should be increased as well. However, the stress of the stressed cap layer 46 may crack or break either the stressed cap layer 46 itself or the structure of the MOS transistor 34 when the stress of the stressed cap layer 46 has reached beyond a limit. Thereafter, the functionality of the stressed cap layer 46 is dramatically reduced, and the operation of the MOS transistor 34 is thereby damaged.

SUMMARY OF THE INVENTION

It is the primary object of the present invention to provide a method for forming a MOS transistor and the related structure, where the stressed cap layer is able to expose a bended portion of the gate structure so that the MOS transistor is able to obtain an improved performance.

According to the present invention, a method of forming a MOS transistor is disclosed. First, a semiconductor substrate is prepared. Subsequently, a gate structure is formed on the semiconductor substrate. The gate structure includes a first strip portion and a second strip portion that is not parallel to the first strip portion. The gate structure further includes a junction between the first strip portion and the second strip portion. Thereafter, a stressed cap layer is formed on the semiconductor substrate, and for covering the gate structure. Next, a portion of the stressed cap layer is removed to expose the junction between the first strip portion and the second strip portion.

From one aspect of the present invention, a MOS transistor is disclosed. The MOS transistor includes a semiconductor substrate, a gate structure disposed on the semiconductor substrate, a source region disposed in the semiconductor substrate, a drain region disposed in the semiconductor substrate, a channel region disposed in the semiconductor substrate under the gate structure between the source region and the drain region, and a stressed cap layer covering the gate structure, the source region, and the drain region. The gate structure includes a first strip portion and a second strip portion that is not parallel to the first strip portion, and the gate structure further includes a junction between the first strip portion and the second strip portion. The stressed cap layer exposes the junction between the first strip portion and the second strip portion.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
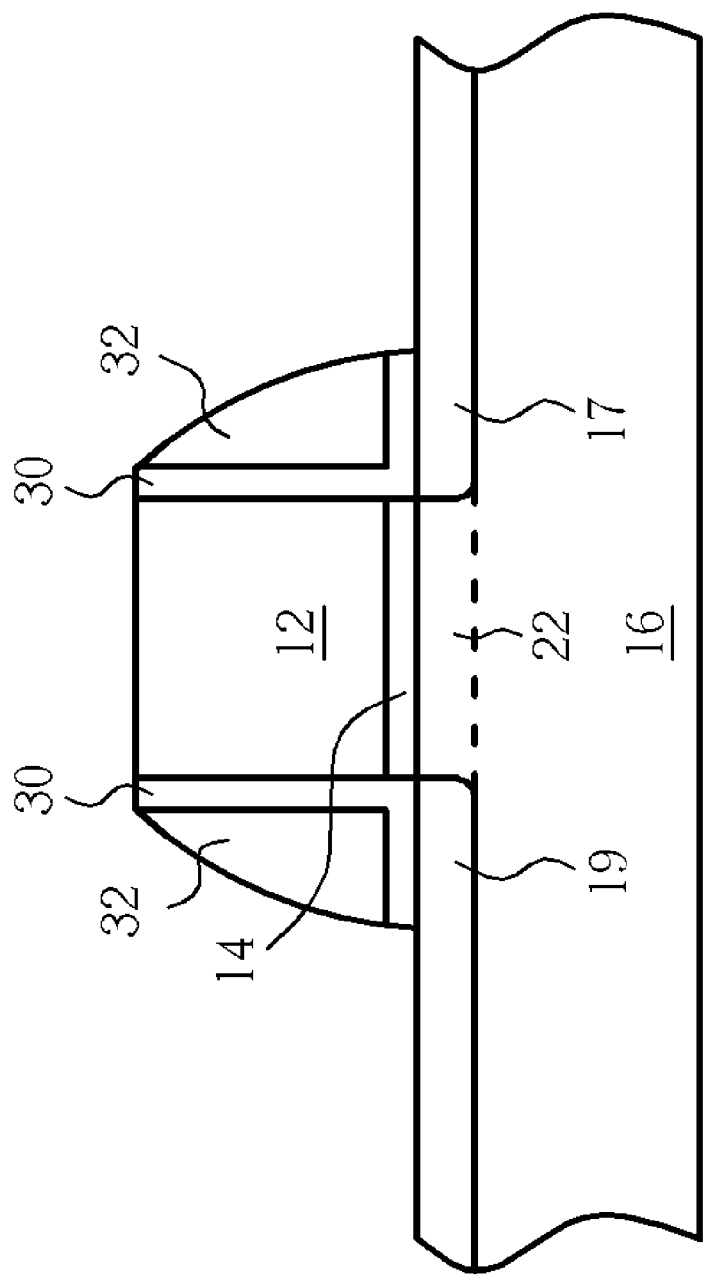
FIGS. 1-3 are schematic diagrams illustrating a conventional method of fabricating a MOS transistor.
Figure 2:
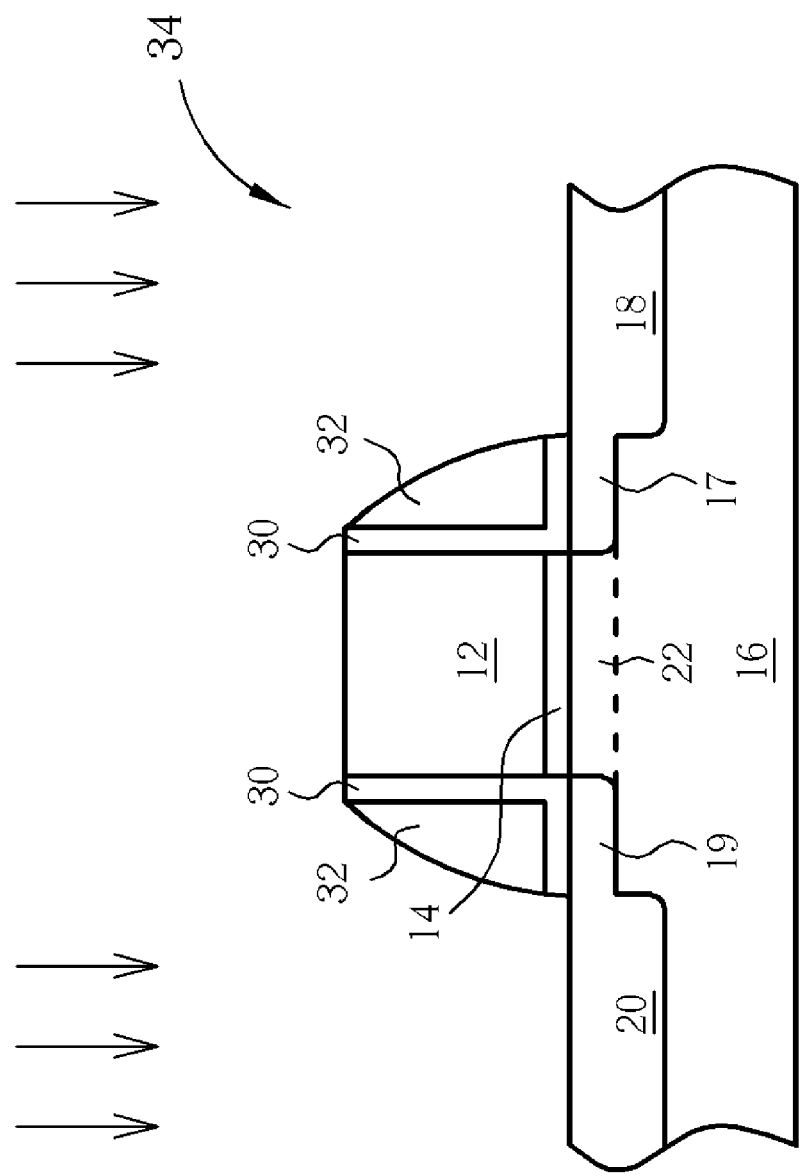
Figure 3:
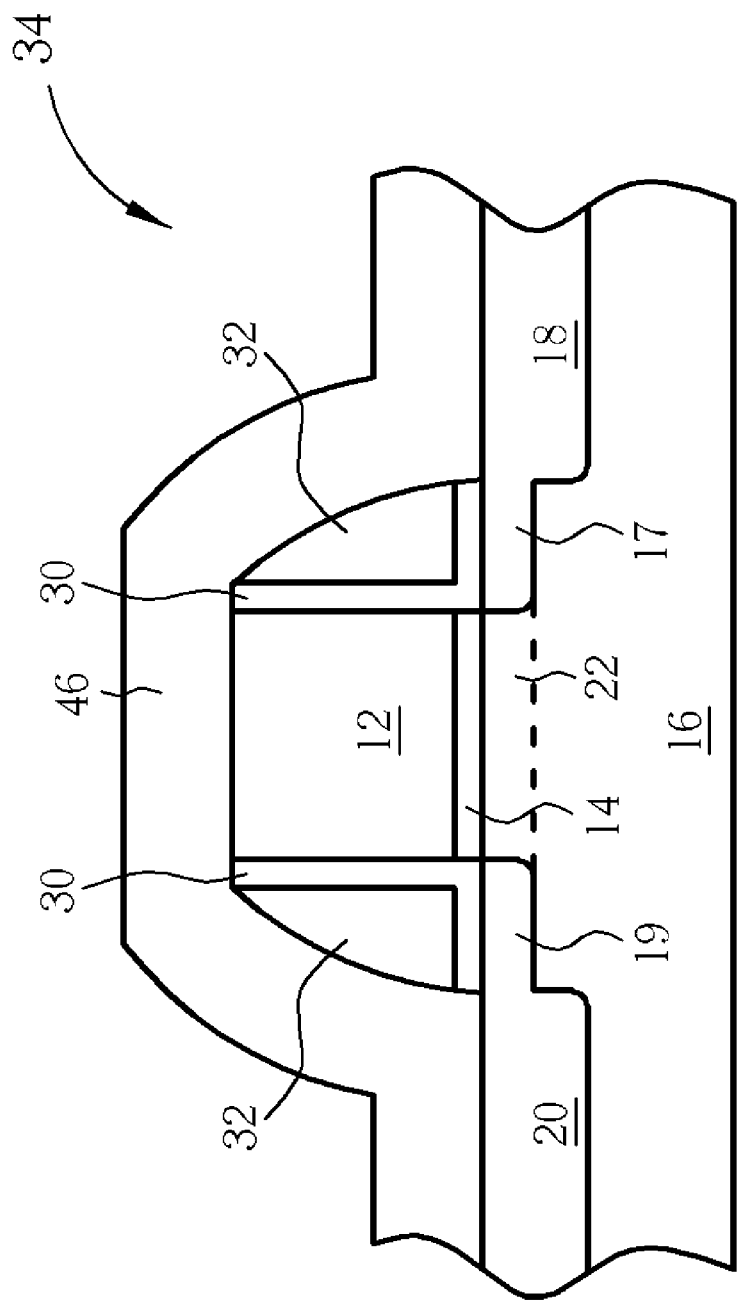
Figure 4:
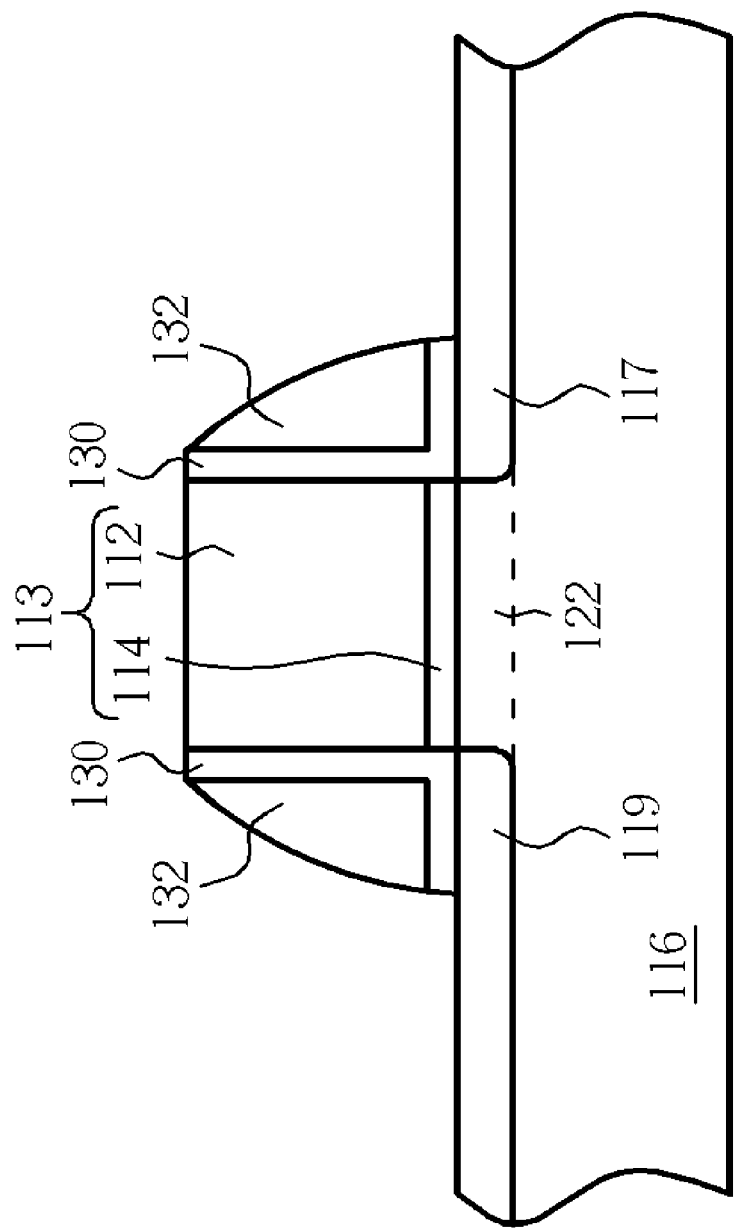
FIGS. 4-10 are schematic diagrams illustrating a method of fabricating a MOS transistor in accordance with a first preferred embodiment of the present invention.
Figure 5:
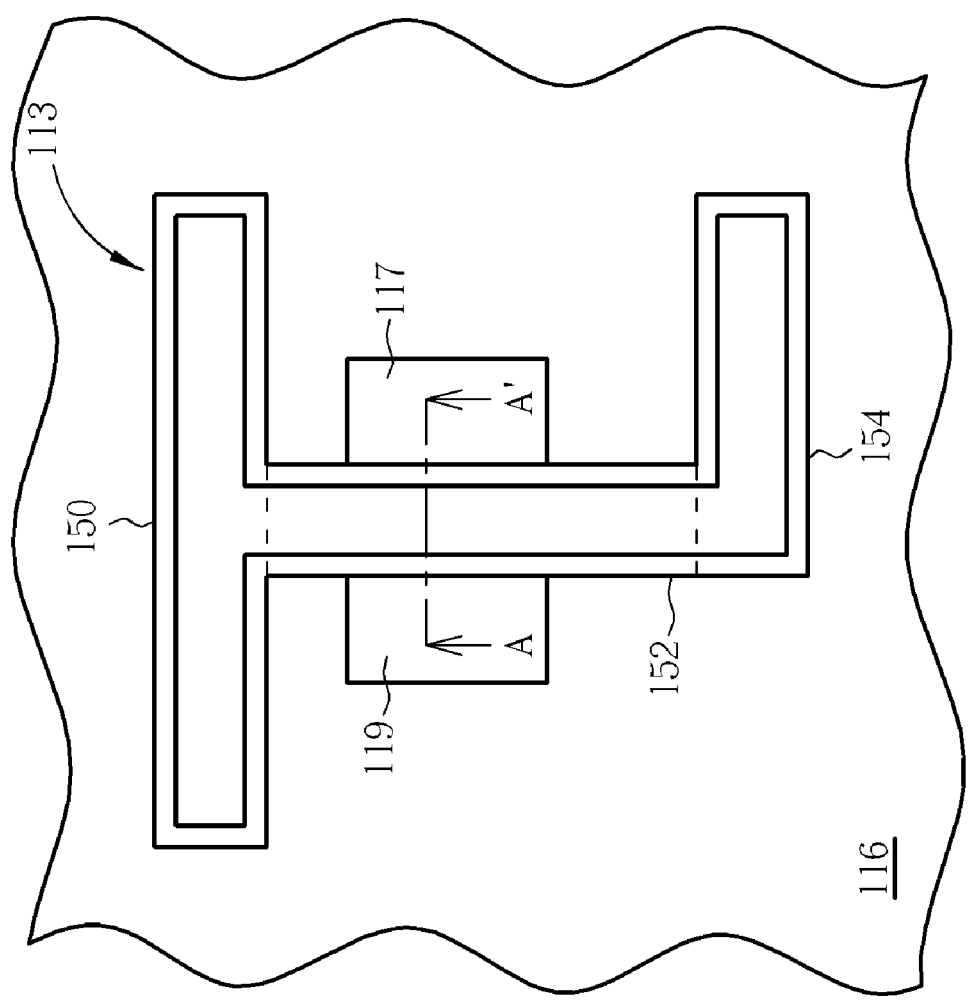

Please refer to FIGS. 4-10, which are schematic diagrams illustrating a method of fabricating a MOS transistor in accordance with a first preferred embodiment of the present invention, where FIG. 4 is a cross-sectional diagram illustrating the MOS transistor shown in FIG. 5 taken along the line A-A', and like number numerals designate similar or the same parts, regions or elements. It is to be understood that the drawings are not drawn to scale and are shown only for illustration purposes. It is also to be understood that various lithographic and etching processes relating to the method of the present invention are well-known in the art and thus need not be explicitly shown in the drawings.

As shown in FIG. 4, a semiconductor substrate 116 is first prepared. The semiconductor substrate 116 may be a silicon-containing substrate or a silicon-on-insulator (SOI) substrate, but is not limited thereto. A gate dielectric layer 114 and a gate 112 which is disposed on the gate dielectric layer 114 are formed on the semiconductor substrate 116. The gate dielectric layer 114 and the corresponding gate 112 can form a gate structure 113. Subsequently, an ion implantation process is carried out by utilizing the gate 112 as an implanting mask. A shallow source extension 117 and a shallow drain extension 119 are therefore formed on the two opposite sides of the gate 112 within the semiconductor substrate 116, where the source extension 117 and the corresponding drain extension 119 are separated by a channel region 122 of the MOS transistor. Afterwards, at least two material layers (not shown in the figures) are formed by chemical vapor deposition (CVD) processes to cover the gate 112 and the semiconductor substrate 116. An anisotropic etching process is next performed on the two material layers to change the two material layers into a liner 130 and a spacer 132. As shown in FIG. 5, the gate structure 113 includes a first strip portion 150, a second strip portion 152 and a third strip portion 154. The first strip portion 150 and the second strip portion 152 are substantially perpendicular to and connected to each other, and thus form a T-shape structure. The second strip portion 152 and the third strip portion 154 are substantially perpendicular to and connected to each other, and thus form a L-shape structure.

The gate 112 generally includes conductive materials, such as doped polysilicon; and the gate dielectric layer 114 may be made of high-k materials, such as silicon dioxide or silicon nitride. The liner 130 is disposed around the sidewall of the gate 112; and the spacer 132 is disposed on the sidewall of the corresponding liner 130. The liners 130 are typically L-shaped, and may further include an offset spacer. A liner which includes an offset spacer is known in the art, and is thus omitted in the figures. The liners 130 may include silicon oxide, and the spacer 132 may include single film or multiple films made from a silicon nitride compound or a silicon oxide compound. The MOS transistor fabricated in this embodiment can be an NMOS transistor or a PMOS transistor, and the NMOS transistor is preferred. For forming the NMOS transistor, an N-type ion implantation process can be carried out to dope the N-type dopant species, such as arsenic, antimony or phosphorous, into the semiconductor substrate 116. For forming the PMOS transistor, a P-type ion implantation process can be carried out to dope the P-type dopant species, such as boron or aluminum, into the semiconductor substrate 116.

Figure 6:
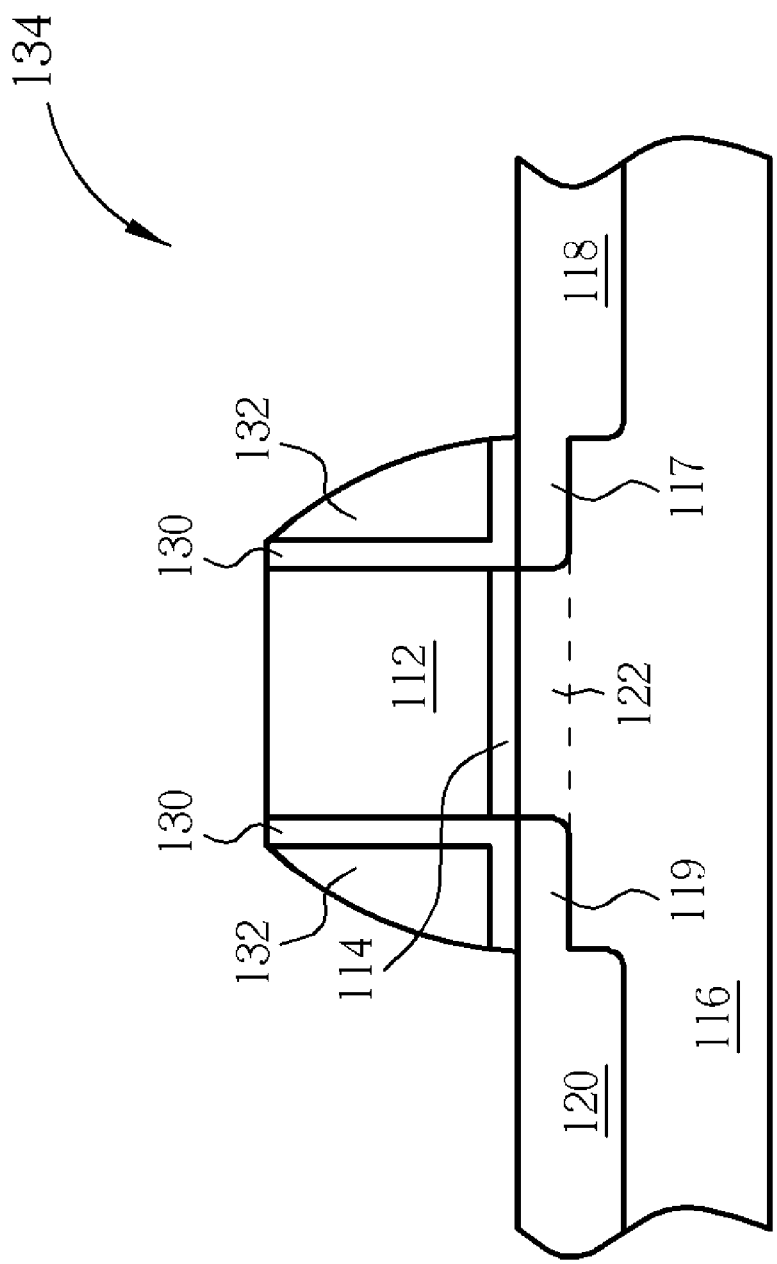

As shown in FIG. 6, after forming the spacer 132, another ion implantation process is carried out to implant dopants into the semiconductor substrate 116 by utilizing the gate structure 113 as an implanting mask. As a result, a source region 118 and a drain region 120 are formed in the semiconductor substrate 116 on two opposite sides of the gate 112. In addition, the semiconductor substrate 116 can optionally undergo an activating process, such as a rapid thermal annealing process or an annealing process after forming the source regions 118 and the drain regions 120. The purpose of the activating process is to activate the dopants implanted in the source extension 117, the drain extension 119, the source region 118, and the drain region 120, and to repair damage to the crystal structure induced by the previous active implant process. Since there are other thermal processes included in the subsequent processes, this activating process is not necessary here. The activating process can be performed after a stressed cap layer is formed to activate the dopants implanted in the source extension 117, the drain extension 119, the source region 118, and the drain region 120.

Figure 7:
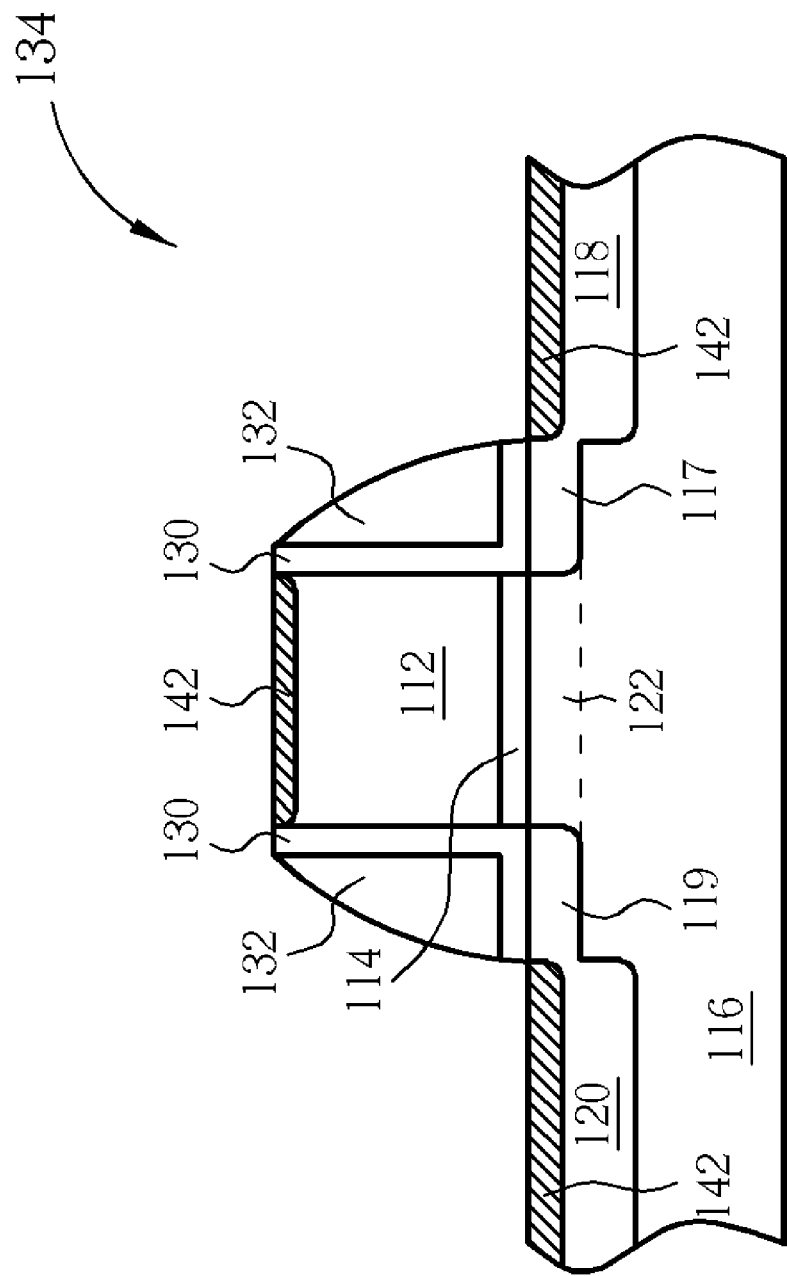

As shown in FIG. 7, a salicide process is thereafter performed. At least a metal layer (not shown in the figures), such as a nickel layer, is sputtered onto the surface of the semiconductor substrate 116. The metal layer covers the surfaces of the gate 112, the source region 118, the drain region 120, and the semiconductor substrate 116. Next, a rapid thermal annealing process can be performed to form a salicide layer 142 by reacting the metal layer with the gate 112, the source region 118, and the drain region 120 which are in direct contact. Furthermore, a selective wet etching process can be performed to remove the unreacted metal layer by utilizing mixtures containing $NH_4OH/H_2O_2/H_2O$ (ammonia hydrogen peroxide mixture, APM) or $H_2SO_4/H_2O_2$ (sulfuric acid-hydrogen peroxide mixture, SPM).

Figure 8:
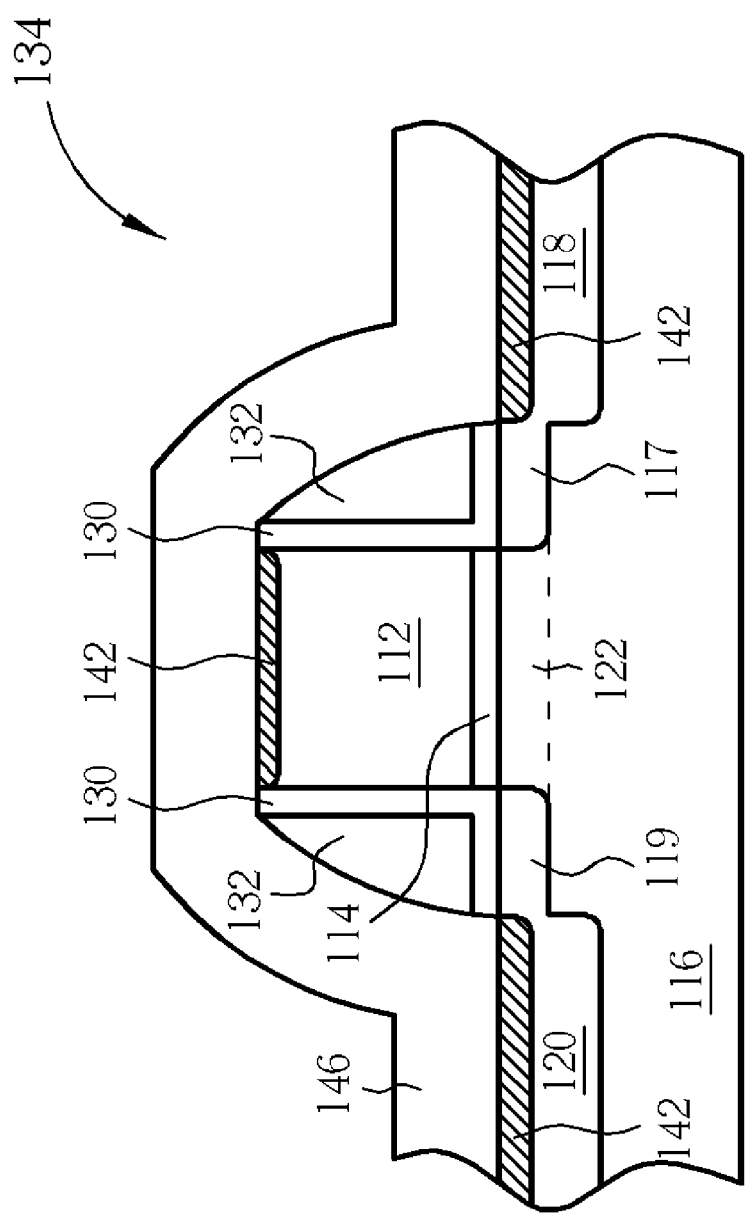

As shown in FIG. 8, a stressed cap layer 146 is formed on the surface of the semiconductor substrate 116, for covering the surfaces of the spacer 132 and the salicide layer 142. In this preferred embodiment, the stressed cap layer 146 can be formed by a deposition process, such as a plasma-enhanced chemical vapor deposition (PECVD) process, a sub-atmospheric pressure chemical vapor deposition (SACVD) process, or a high-density plasma chemical vapor deposition (HDPCVD) process. The thicknesses of the stressed cap layer 146 can be in a range from 10 angstroms to 3000 angstroms, and the stressed cap layer 146 can include any material layer that can impart stress. For instance, the stressed cap layer 146 can contain a silicon nitride ($Si_xN_y$) layer or a silicon oxide ($Si_xO_y$) layer.

Figure 9:
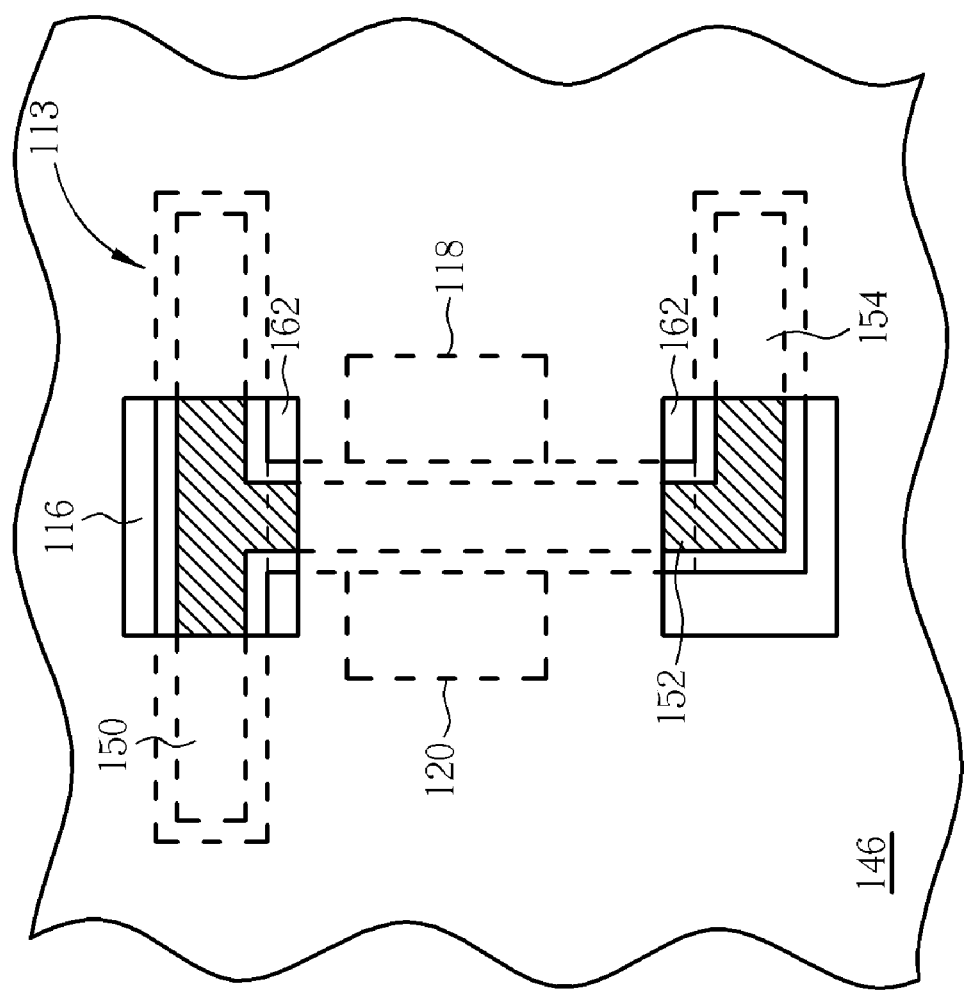

Thereafter, as shown in FIG. 9, portions of the stressed cap layer 146 are removed by the lithographic and etching process to form two stress release holes 162. For example, one of the stress release holes 162 can expose the junction between the first strip portion 150 and the second strip portion 152, and another stress release hole 162 can expose the junction between the second strip portion 152 and the third strip portion 154. Next, an activating process, such as a UV curing process, an annealing process, a thermal spike annealing process, or an e-beam treatment, is performed on the stressed cap layer 146 to make the MOS transistor 134 memorize or accumulate the stress of the stressed cap layer 146, and at the same time to expand the lattice arrangement of the semiconductor substrate 116 in the channel region 122. Thus, the electron mobility in the channel region 122 is increased, and the driving current of the MOS transistor 134 is therefore raised. It deserves to be mentioned that the quantity, size, and shape of the stress release holes should not be limited to the stress release hole 162 of the first preferred embodiment. Any stress release hole that can expose the bended portion of the gate structure or can expose the weakened portion of the MOS transistor also corresponds to the spirit of the present invention.

Figure 10:
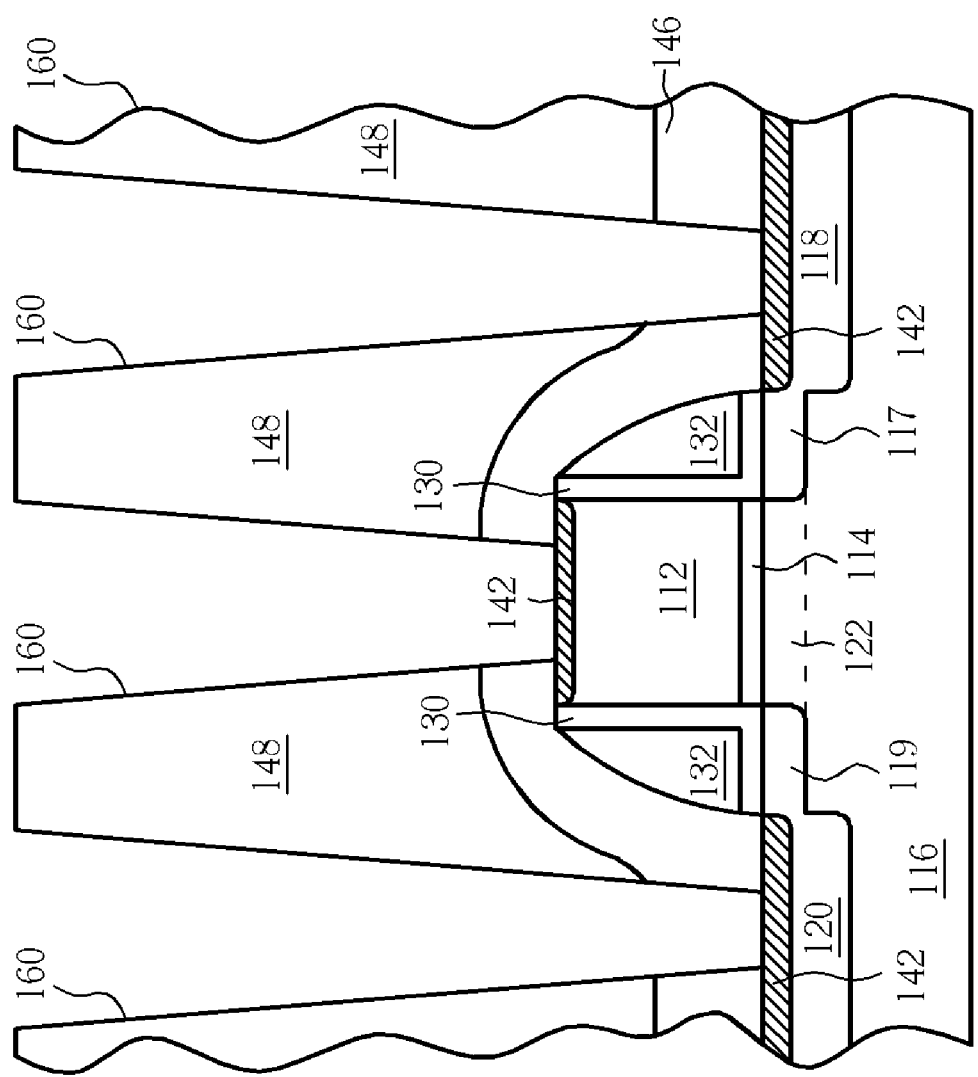

As shown in FIG. 10, a dielectric layer 148 is subsequently deposited on the semiconductor substrate 116. The dielectric layer 148 may include silicon oxide, doped silicon oxide, or other suitable materials such as low-k materials. Lithographic and etching processes are thereon carried out on the dielectric layer 148 by utilizing the stressed cap layer 146 as a contact etch stop layer (CESL). When the surface of the stressed cap layer 146 is exposed by the etching process, the process parameters can be adjusted so as to form contact holes 160 in the stressed cap layer 146 and the dielectric layer 148. The contact holes 160 can communicate with the gate 112, the source regions 118, and the drain regions 120 of the MOS transistor 134, respectively.

According to the conventional typical process of forming contact plugs, the contact holes 160 are thereafter filled with at least a conducting material, such as copper, aluminum, tungsten, or alloy thereof, so that the contact plugs which are communicating with the MOS transistor 134 and the MOS transistor 136 are formed, and thereby completing this embodiment.

Figure 11:
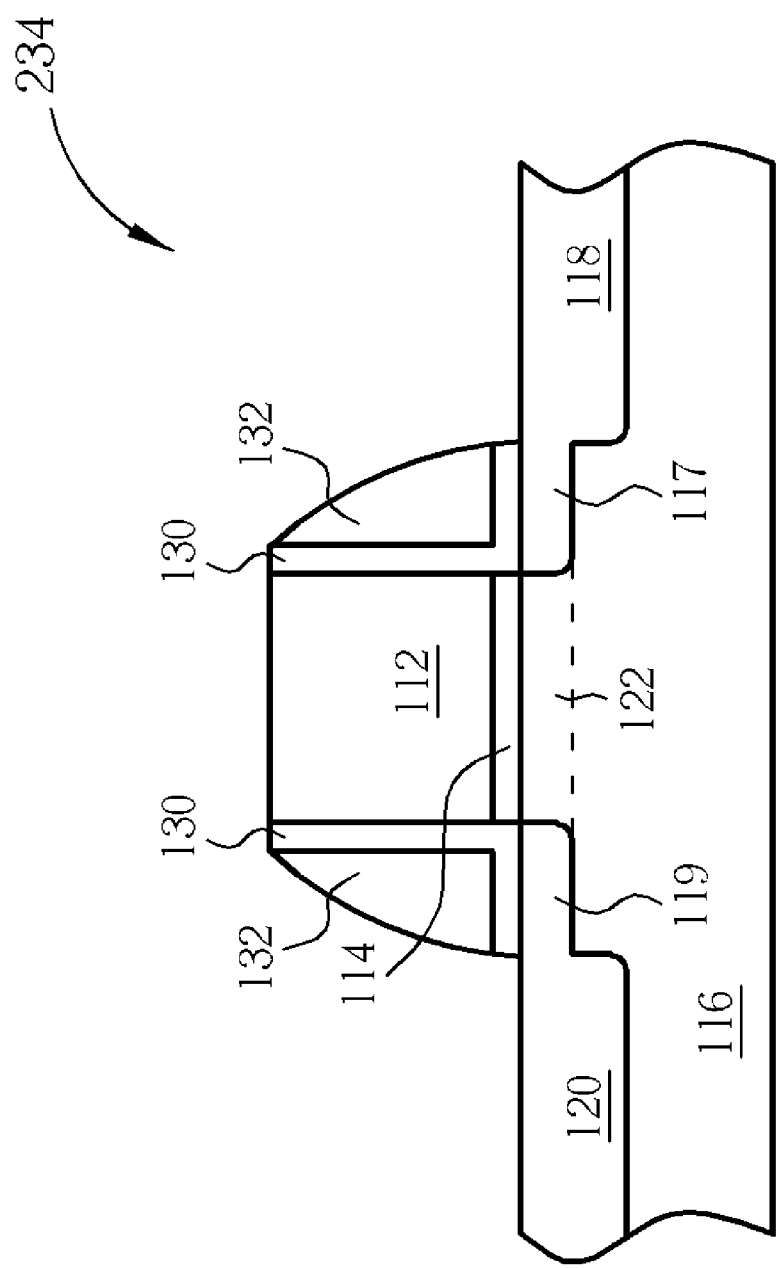
FIGS. 11-15 are schematic diagrams illustrating a method of fabricating a MOS transistor in accordance with a second preferred embodiment of the present invention.

Furthermore, the stressed cap layer of the present invention can also be applied to poly stressor technology. Please refer to FIGS. 11-15, which are schematic diagrams illustrating a method of fabricating a MOS transistor in accordance with a second preferred embodiment of the present invention, where FIG. 11 is a cross-sectional diagram illustrating the MOS transistor shown in FIG. 12 taken along the line B-B'. As shown in FIG. 11, a semiconductor substrate 116 is first prepared, and a MOS transistor 234 is thereafter formed on the semiconductor substrate 116.

Figure 12:
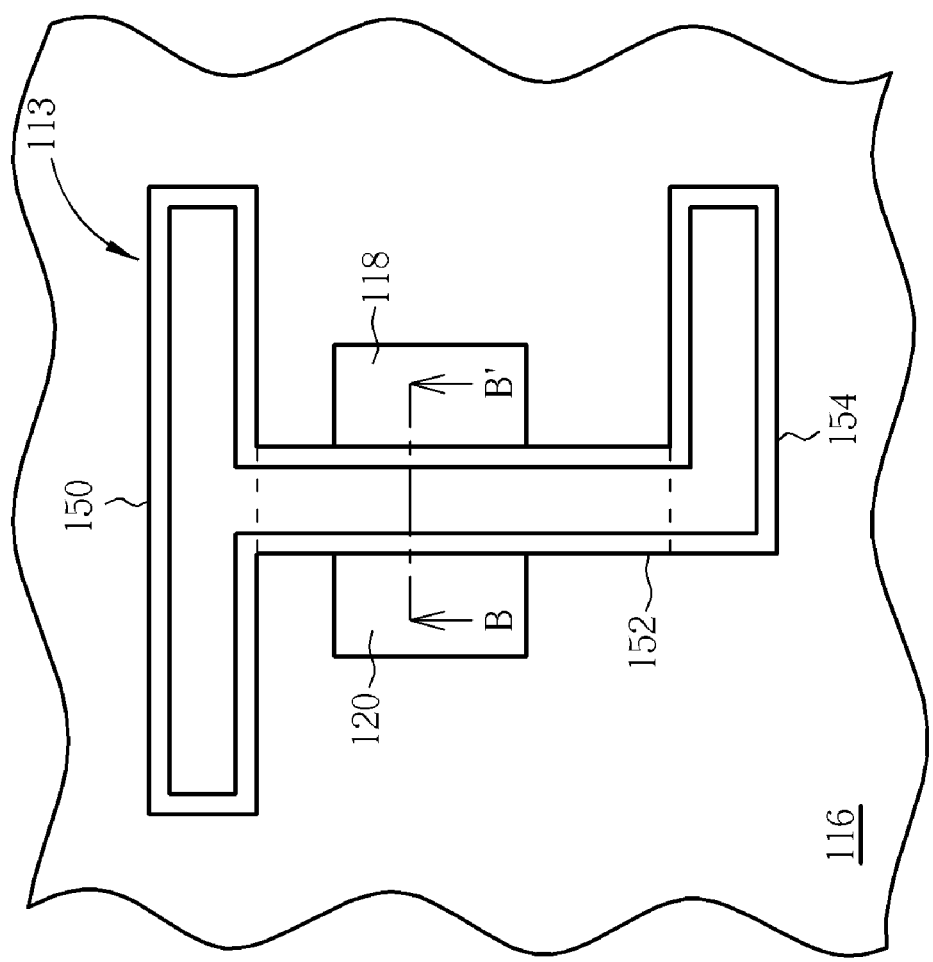

The MOS transistor 234, having a structure similar to the MOS transistor 134, can be a NMOS transistor or a PMOS transistor, and the NMOS transistor is preferred. The MOS transistor 234 includes a gate structure 113, and the gate structure 113 has a gate dielectric layer 114 and a gate 112 thereon. Furthermore, the MOS transistor 234 can optionally include a spacer 132 and a liner 130 positioned around the sidewall of the gate structure 113. The channel region 122 of the MOS transistor 234 is located in the semiconductor substrate 116 under the gate structure 113, and the semiconductor substrate 116 further includes a source region 118 and a drain region 120 on the two opposite sides of the channel region 122. As shown in FIG. 12, the gate structure 113 includes a first strip portion 150, a second strip portion 152 and a third strip portion 154. The first strip portion 150 and the second strip portion 152 are substantially perpendicular to and connected to each other, and form a T-shape structure. The second strip portion 152 and the third strip portion 154 are substantially perpendicular to and connected to each other, and form a L-shape structure.

Figure 13:
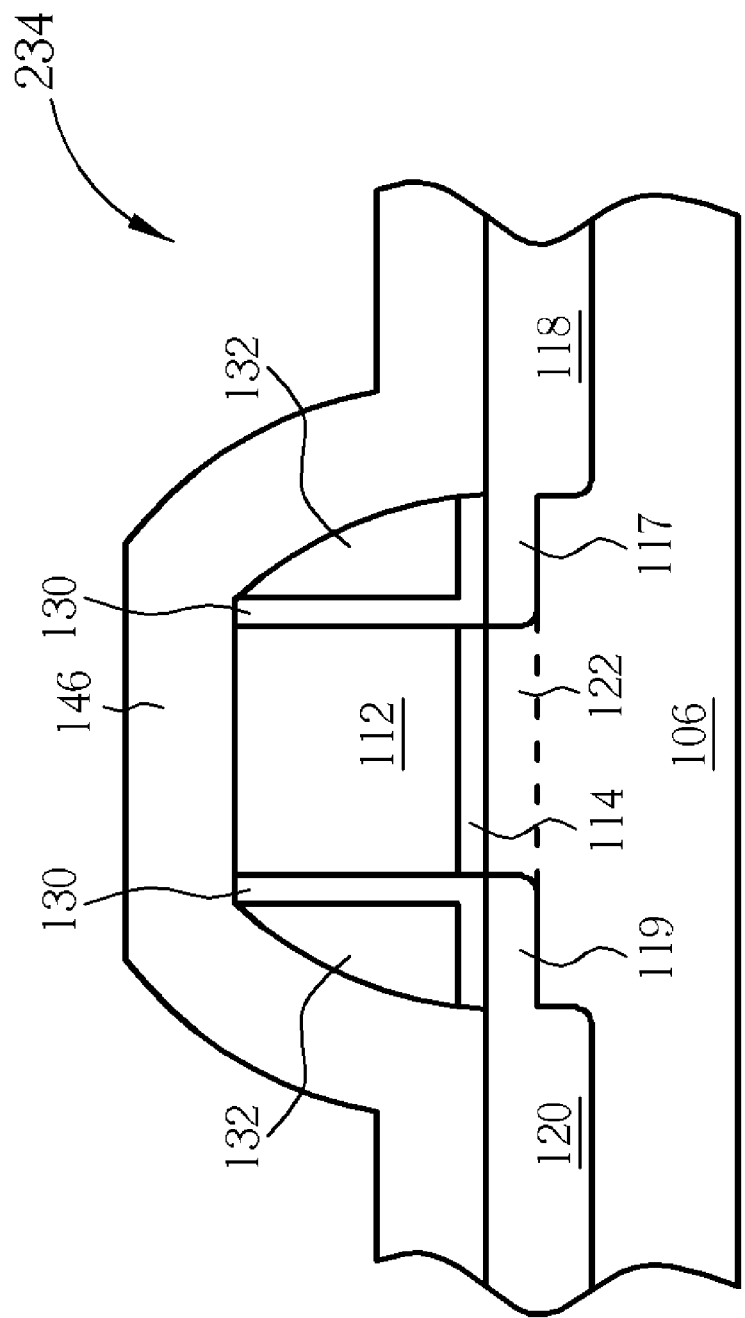
Figure 14:
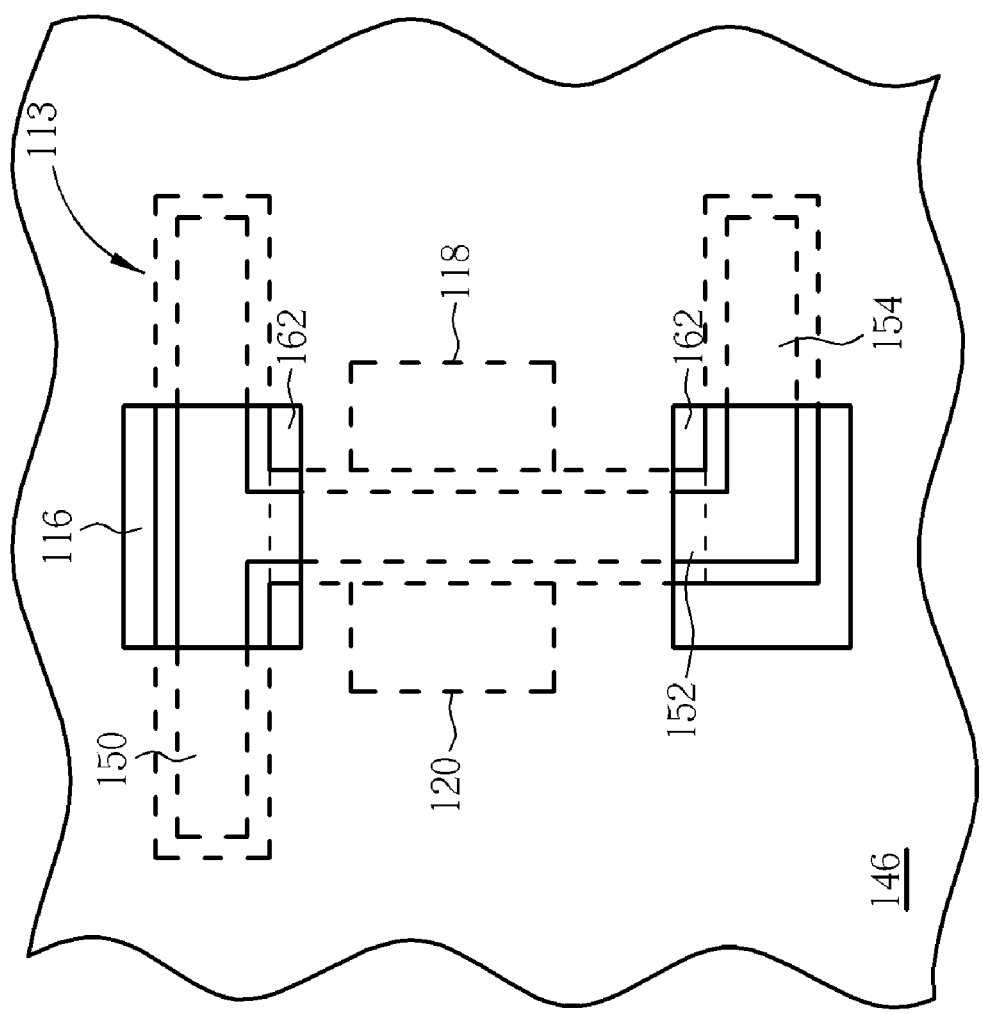

As shown in FIG. 13, a stressed cap layer 146 is thereafter formed on the surface of the semiconductor substrate 116 by using a plasma-enhanced chemical vapor deposition process, a sub-atmospheric pressure chemical vapor deposition process, or a high-density plasma chemical vapor deposition process. In accordance with one aspect of the present invention, the stressed cap layer 146 can contain any material layer that can impart stress, such as a silicon nitride compound layer or a silicon oxide compound layer. Thereafter, as shown in FIG. 14, portions of the stressed cap layer 146 are removed by using the lithographic and etching processes to form two stress release holes 162. For example, one of the stress release holes 162 can expose the junction between the first strip portion 150 and the second strip portion 152, and another stress release hole 162 can expose the junction between the second strip portion 152 and the third strip portion 154. Next, an activating process, such as an UV curing process, an annealing process, a thermal spike annealing process, or an e-beam treatment, is performed on the stressed cap layer 146 to make the MOS transistor 134 to memorize the stress of the stressed cap layer 146 and at the same time to expand the lattice arrangement of the semiconductor substrate 116 in the channel region 122. Thus, the electron mobility in the channel region 122 is increased, and the driving current of the MOS transistor 134 is therefore raised.

Figure 15:
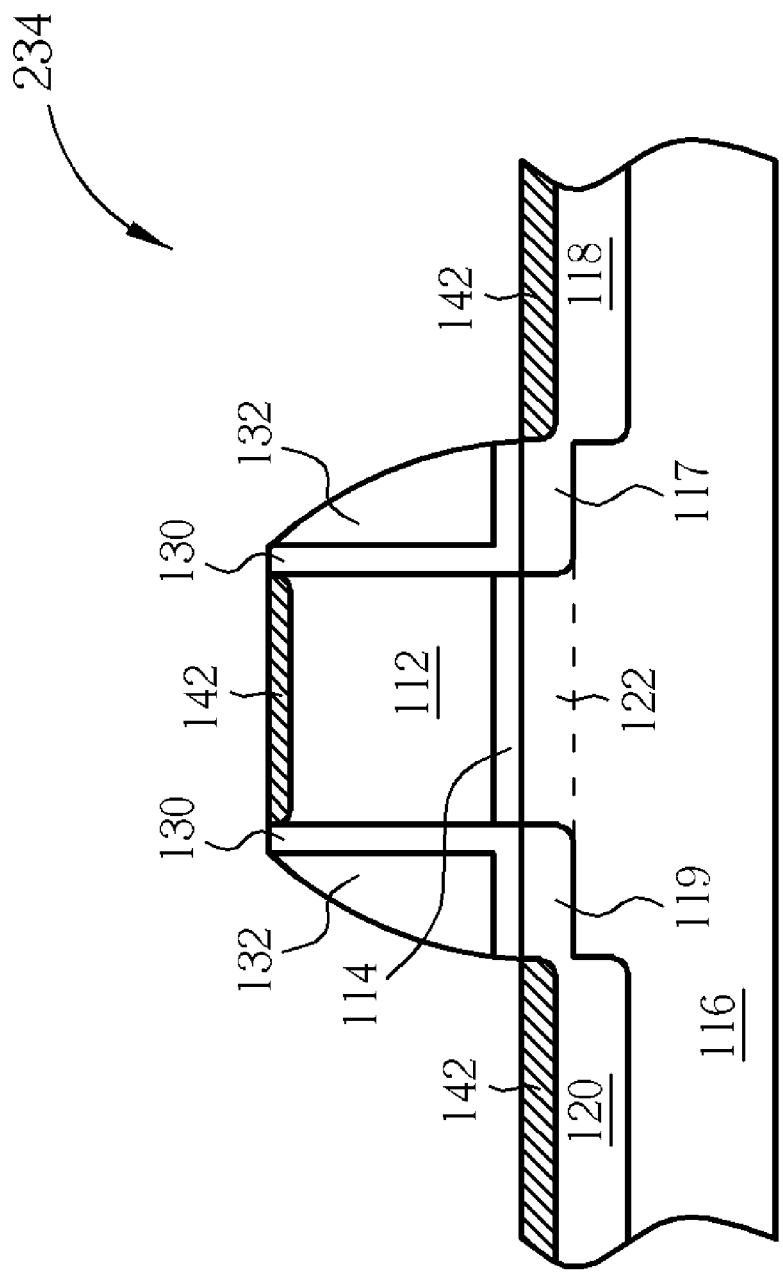

As shown in FIG. 15, afterwards, an etching process is performed to remove the stressed cap layer 146 entirely. Thereafter, a salicide process is performed. At least a metal layer (not shown in the figures) is sputtered onto the surface of the semiconductor substrate 116. The metal layer covers the surfaces of the gate 112, the source region 118, the drain region 120, and the semiconductor substrate 116. Next, a rapid thermal annealing process can be performed to form a salicide layer 142 by reacting the metal layer with the gate 112, the source region 118, and the drain region 120 which are in direct contact. Furthermore, a selective wet etching process is performed to remove the unreacted metal layer by utilizing mixtures containing APM or SPM, and this embodiment is completed.

If the gate structure has a bended portion, cracks occur frequently in the traditional stressed cap layer covering on the bended portion of the gate structure, and occur easily in the bended portion of the gate structure in the meantime. The cracks in the gate structure seriously interfere with the normal operation of the MOS transistor, and even to the point of rendering the MOS transistor completely defective. It is the main spirit of the present invention to remove portions of the stressed cap layer disposed around the bended portion of the gate structure so as to prevent cracks. Accordingly, the gate structure of the present invention should not be limited to the T-shape structure or the L-shape structure, and the two strip portions of the gate structure can have any bended portion comprising of any possible angles. In addition, the utilization of the present invention should not be limited to the NMOS transistor or the PMOS transistor shown in the above-mentioned embodiments. Any semiconductor device, which has a stressed cap layer exposing a bended portion of a protrusion structure, can be in accordance to the spirit of the present invention. For example, the present invention can be applied to a complementary metal-oxide semiconductor (CMOS) transistor, a lateral diffused metal-oxide semiconductor (LD MOS) transistor, or even a MOS transistor having strained silicon made by selective area epitaxial (SAE) technology. Experiments and measurements have shown that the stressed cap layer and the MOS transistor are effectively protected from cracks, and the electron mobility in the channel region and the driving current of the MOS transistor are therefore raised.

Those skilled in the art will readily observe that numerous modifications and alterations of the device and method may be made while retaining the teachings of the invention.

What is claimed is:

1. A method of forming a metal-oxide-semiconductor (MOS) transistor, comprising:
   providing a semiconductor substrate;
   forming a gate structure on the semiconductor substrate, the gate structure comprising a first strip portion and a second strip portion that is not parallel to the first strip portion, the gate structure further comprising a junction between the first strip portion and the second strip portion;
   forming a stressed cap layer on the semiconductor substrate, covering the gate structure; and
   removing a portion of the stressed cap layer to expose a portion of the semiconductor substrate, and the junction between the first strip portion and the second strip portion without punching through the gate structure.

2. The method of forming a MOS transistor according to claim 1, wherein the first strip portion and the second strip portion form a T-shape structure.

3. The method of forming a MOS transistor according to claim 1, wherein the first strip portion and the second strip portion form a L-shape structure.

4. The method of forming a MOS transistor according to claim 1, further comprising of forming a source region and a drain region in the semiconductor substrate on two opposite sides of the gate structure after forming the gate structure.

5. The method of forming a MOS transistor according to claim 4, further comprising of forming a salicide layer on a surface of the gate structure, a surface of the source region, and a surface of the drain region after forming the source region and the drain region.

6. The method of forming a MOS transistor according to claim 5, further comprising of performing an activating process on the stressed cap layer after removing the portion of the stressed cap layer.

7. The method of forming a MOS transistor according to claim 6, wherein after performing the activating process, further comprising:
 forming a dielectric layer on the semiconductor substrate; and
 performing an etching process on the dielectric layer and the stressed cap layer so as to form a plurality of contact holes in the dielectric layer; and the contact holes exposing the gate structure, the source region, and the drain region.

8. The method of forming a MOS transistor according to claim 4, further comprising of performing an activating process on the stressed cap layer after removing the portion of the stressed cap layer.

9. The method of forming a MOS transistor according to claim 8, further comprising of removing the stressed cap layer entirely after performing the activating process.

10. The method of forming a MOS transistor according to claim 9, further comprising of forming a salicide layer on a surface of the gate structure, a surface of the source region, and a surface of the drain region after removing the stressed cap layer entirely.

11. The method of forming a MOS transistor according to claim 1, wherein the stressed cap layer comprises a silicon nitride layer.

12. A MOS transistor, comprising:
 a semiconductor substrate;
 a gate structure disposed on the semiconductor substrate, comprising a first strip portion and a second strip portion that is not parallel to the first strip portion, further comprising a junction between the first strip portion and the second strip portion;
 a source region disposed in the semiconductor substrate;
 a drain region disposed in the semiconductor substrate;
 a channel region disposed in the semiconductor substrate under the gate structure between the source region and the drain region; and
 a stressed cap layer covering the gate structure, the source region, and the drain region, and exposing the junction and a re-entrant between the first strip portion and the second strip portion.

13. The MOS transistor according to claim 12, further comprising a salicide layer disposed on a surface of the gate structure, a surface of the source region, and a surface of the drain region.

14. The MOS transistor according to claim 12, wherein the first strip portion and the second strip portion form a T-shape structure.

15. The MOS transistor according to claim 12, wherein the first strip portion and the second strip portion form a L-shape structure.

16. The MOS transistor according to claim 12, wherein the stressed cap layer comprises a silicon nitride layer.

17. The MOS transistor according to claim 12, wherein the gate structure comprises:
 a gate dielectric layer disposed on the semiconductor substrate;
 a gate disposed on the gate dielectric layer; and
 a spacer covering a sidewall of the gate.

* * * * *